United States Patent
Toh et al.

(10) Patent No.: US 8,999,828 B2
(45) Date of Patent: Apr. 7, 2015

(54) METHOD AND DEVICE FOR A SPLIT-GATE FLASH MEMORY WITH AN EXTENDED WORD GATE BELOW A CHANNEL REGION

(75) Inventors: Eng Huat Toh, Singapore (SG); Shyue Seng (Jason) Tan, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 108 days.

(21) Appl. No.: 13/197,367

(22) Filed: Aug. 3, 2011

(65) Prior Publication Data
US 2013/0032869 A1    Feb. 7, 2013

(51) Int. Cl.
*H01L 29/788* (2006.01)
*H01L 21/28* (2006.01)
*H01L 29/423* (2006.01)
*H01L 29/66* (2006.01)
*H01L 29/792* (2006.01)

(52) U.S. Cl.
CPC ...... *H01L 29/7881* (2013.01); *H01L 21/28273* (2013.01); *H01L 21/28282* (2013.01); *H01L 29/42328* (2013.01); *H01L 29/42344* (2013.01); *H01L 29/66825* (2013.01); *H01L 29/66833* (2013.01); *H01L 29/792* (2013.01)

(58) Field of Classification Search
CPC ............ H01L 27/11517; H01L 29/7881; H01L 29/792; H01L 29/42328; H01L 21/28273; H01L 29/42344; H01L 29/66833; H01L 29/66825

USPC ........ 257/314, E29.255, E21.409, 316, 324, 257/326; 438/591

See application file for complete search history.

(56) References Cited

U.S. PATENT DOCUMENTS

| | | | | |
|---|---|---|---|---|
| 5,386,132 | A * | 1/1995 | Wong | 257/316 |
| 5,411,905 | A * | 5/1995 | Acovic et al. | 438/156 |
| 6,963,108 | B1 * | 11/2005 | Kang et al. | 257/330 |
| 2002/0153546 | A1* | 10/2002 | Verhaar | 257/296 |
| 2005/0145928 | A1* | 7/2005 | Ogura et al. | 257/324 |
| 2005/0146937 | A1* | 7/2005 | Fan et al. | 365/185.17 |
| 2007/0018234 | A1* | 1/2007 | Chindalore et al. | 257/319 |
| 2007/0057313 | A1* | 3/2007 | Kim | 257/315 |
| 2007/0170491 | A1* | 7/2007 | Choi et al. | 257/315 |
| 2009/0224305 | A1* | 9/2009 | Hayashi | 257/316 |
| 2010/0025753 | A1* | 2/2010 | Terai | 257/324 |
| 2010/0159687 | A1* | 6/2010 | Okazaki et al. | 438/591 |
| 2011/0006357 | A1* | 1/2011 | Tsuji | 257/324 |

FOREIGN PATENT DOCUMENTS

WO    WO 2009/104688    *    2/2009

* cited by examiner

*Primary Examiner* — Peter Bradford
(74) *Attorney, Agent, or Firm* — Ditthavong & Steiner, P.C.

(57) ABSTRACT

A split gate memory cell is fabricated with a word gate extending below an upper surface of a substrate having the channel region. An embodiment includes providing a band engineered channel with the word gate extending there through. Another embodiment includes forming a buried channel with the word gate extending below the buried channel.

13 Claims, 6 Drawing Sheets

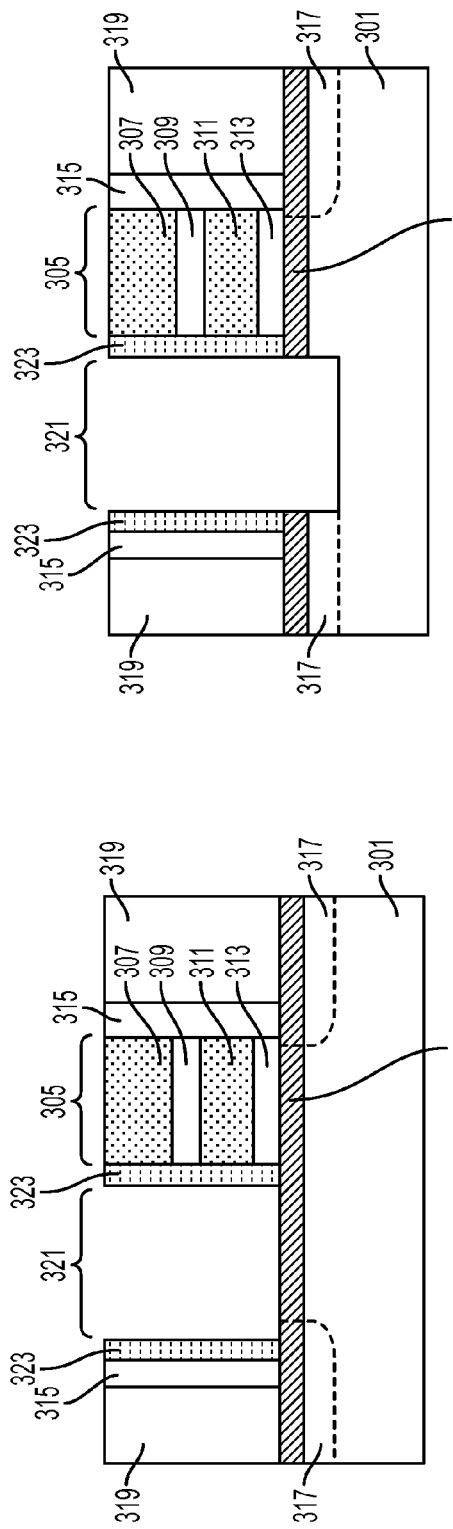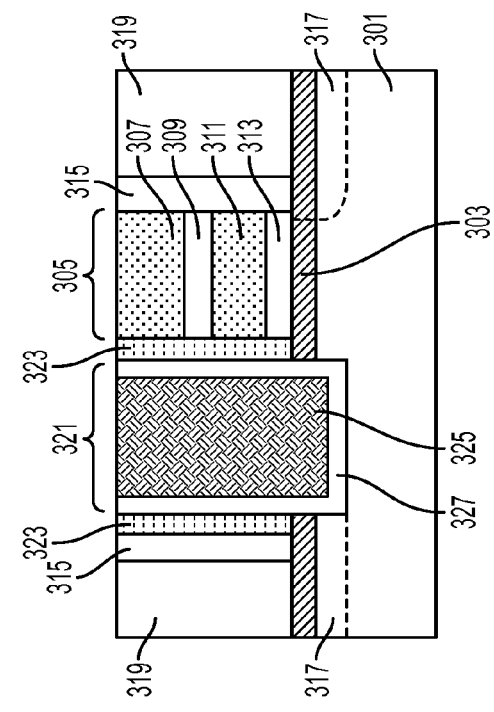

METHOD AND DEVICE FOR A SPLIT-GATE FLASH MEMORY WITH AN EXTENDED WORD GATE BELOW A CHANNEL REGION

TECHNICAL FIELD

The present disclosure relates to flash memory devices with improved program speed. The present disclosure is particularly applicable to flash memory devices for 32 nanometer (nm) technologies and beyond.

BACKGROUND

The split-gate non-volatile memory is a configuration that has been widely used in medium-low density applications. As shown in FIG. 1A, a version of the split-gate non-volatile memory includes source/drain regions 101 in a substrate 103, dielectric spacers 105, a word gate 107 over a gate oxide 109, and a control gate (CG) 111 on an interpoly dielectric (IPD) layer 113 over a floating gate (FG) 115 and a tunneling oxide (TO) layer 117. Another version of the split-gate technology is a split-gate charge trapping (CT) non-volatile memory illustrated in FIG. 1B. Rather than the TO/FG/IPD combination in the version of FIG. 1A, the split-gate CT non-volatile memory includes a tunneling oxide (TO) layer 119, a charge trapping (CT) layer 121, and a blocking oxide (BO) layer 123. One example of such a device is Silicon-Oxide-Nitride-Oxide-Silicon (SONOS). These memory devices may be programmed by mechanisms such as source side injection (SSI) or channel hot electron (CHE). Fowler-Nordheim (FN) tunneling or band-to-band tunneling hot holes (BBHH) may be utilized to remove charges.

Efforts have been made to increase the program/erase speed for scaled power supply voltage, minimize program disturbance as by enhancing punchthrough immunity, improve endurance of the structures, and efficiently remove trapped charges at the sidewall charge trapping layer to prevent their adverse effects and reduce performance fluctuations. For example, adverting to FIG. 2A, in addition to source/drain regions 201 and implant regions 203 in the substrate 205, dielectric spacers 207, a word gate 209, and a control gate 211, the structure includes an epitaxial layer 213 with light doping for low control gate voltage and a recessed word gate channel for higher injection efficiency.

The approach illustrated in FIG. 2A has proven problematic in several respects. For example, as illustrated in FIG. 2B, the cell size is limited by the source/drain punchthrough immunity during program disturbance. As the source and drain junctions are deep and at the same level, it is more susceptible to punchthrough 215, especially if the channel under the word gate is a narrow bandgap material. Moreover, trapped charges 217 at the sidewall are difficult to remove and interfere with program/erase speed, resulting in cell performance fluctuations.

A need therefore exists for split-gate flash memory devices with improved program and erase performance, reduced punchthrough, and enabling methodology.

SUMMARY

An aspect of the present disclosure is a method of fabricating a memory device exhibiting improved program and erase performance, reduced punchthrough, improved endurance, and reduced trapped charges at sidewalls.

Another aspect of the present disclosure is a memory device exhibiting improved program and erase performance, reduced punchthrough, improved endurance, and reduced trapped charges at sidewalls.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a memory gate stack over a channel region; and providing a word gate extending below an upper surface of a substrate having the channel region.

Aspects of the present disclosure include forming a band engineered channel as the channel region. Embodiments include forming the band engineered channel as a single layer or multiple layers. Another aspect of the present disclosure is forming a buried channel as the channel region. Embodiments include the buried channel extending 3 nm to 30 nm below the upper surface of the substrate. Additional aspects include providing the word gate such that it extends below the channel region. Aspects include providing the word gate at the same depth, deeper than, or shallower than the channel region.

Further aspects of the present disclosure include removing a portion of the memory gate stack to form an opening. Other aspects include forming a band engineered channel as the channel region; forming the opening through the band engineered channel; and providing a dielectric layer and the word gate in the opening. Additional aspects include providing the word gate extending through the band engineered channel. Other aspects include forming a buried channel as the channel region; forming the opening alongside of and below the buried channel; and providing a dielectric layer and the word gate in the opening. Another aspect includes providing the word gate extending at least 5 nm below the upper surface of the substrate.

Another aspect of the present disclosure is a device including: a memory gate stack over a channel region; and a word gate extending below an upper surface of a substrate having the channel region.

Aspects include a device having the channel region comprise a band engineered channel, which may comprise one or more layers. Additional aspects include a device having the word gate formed in an opening through the channel region, wherein the word gate may extend below the channel region. Other aspects include a device having a buried channel in the substrate. Further aspects include the word gate extending below the channel region.

Another aspect of the present disclosure is a method including: providing a memory gate stack over a channel region; removing a portion of the memory gate stack to form an opening; and providing a word gate, having sidewall spacers on side surfaces of the word gate, in the opening. Additional aspects include: providing a band engineered channel as the channel region; and forming the opening such that it extends through the band engineered channel, wherein the word gate extends through the band engineered channel. Other aspects include providing a buried channel as the channel region; and forming the opening such that it extends below the buried channel.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A through 3G schematically illustrate sequential steps of a method in accordance with an embodiment of the present disclosure.

FIGS. 4A and 413 schematically illustrate split-gate structures utilizing a band engineered channel associated respectively with a floating gate type and with a charge trapping type in accordance with embodiments of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems attendant upon conventional split-gate non-volatile memory devices, such as poor program and erase performance, punchthrough, and trapped charge accumulation at sidewalls. The present disclosure addresses and solves such problem by, inter alia, providing an embedded word gate below the surface of the channel region, thereby lengthening the effective channel length ($L_{eff}$) and reducing the source junction depth. As a result, punchthrough is reduced and program disturbance immunity is increased. In addition, a band engineered channel (or a buried channel) is included to increase the impact-ionization rate and, thus, improve the program/erase speed.

FIGS. 3A through 3G schematically illustrate a process flow for fabricating a memory device comprising a word gate extending below an upper surface of a substrate having a channel region in accordance with an embodiment of the present disclosure. Adverting to FIG. 3A, after standard isolation and well implantation (not shown for illustrative convenience) are performed in substrate 301, a band engineered channel 303 is formed as the channel region. The band engineered channel 303 may be formed by selective epitaxial growth (SEG) as a single layer, or in multiple layers having varying dimensions or the same dimensions. For example, each layer may have a thickness of 3 nm to 50 nm and may be formed of silicon germanium (SiGe), silicon (Si), or silicon carbon (Si:C). The band engineered channel 303 may exhibit a desired bandgap as by controlling the composition of the layer and/or doping. In alternative embodiments, a buried channel may be formed in the substrate as the channel region. The buried channel may, for example, be formed by implantation (e.g., doping the surface of the substrate oppositely to that of the substrate).

Figure 1A:
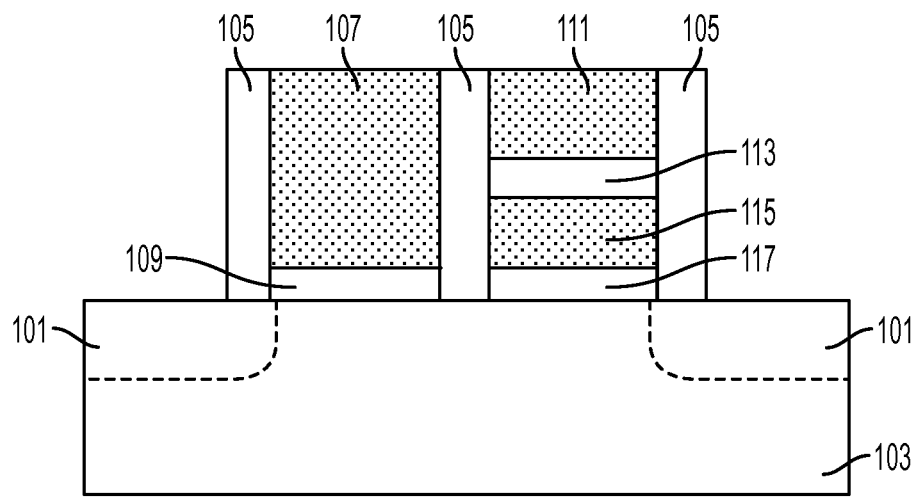
FIGS. 1A and 1B schematically illustrate a conventional split-gate non-volatile memory device.
Figure 1B:
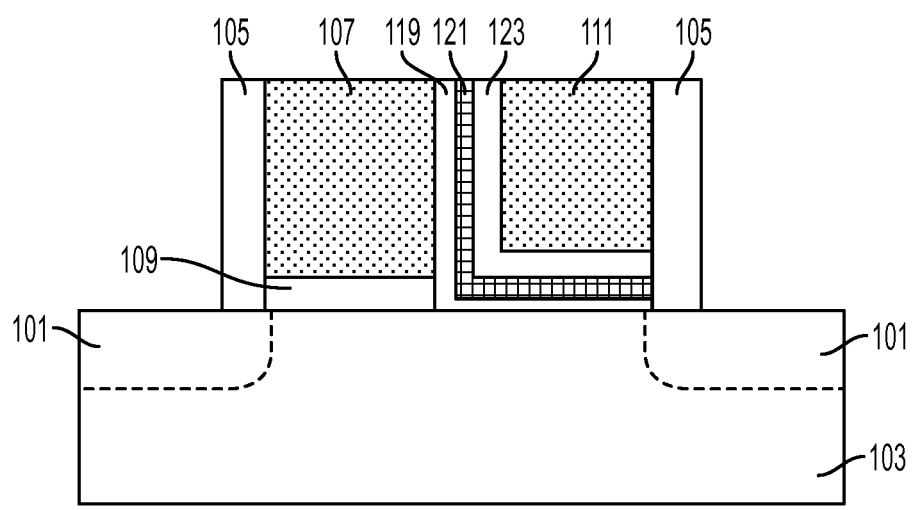
Figure 2A:
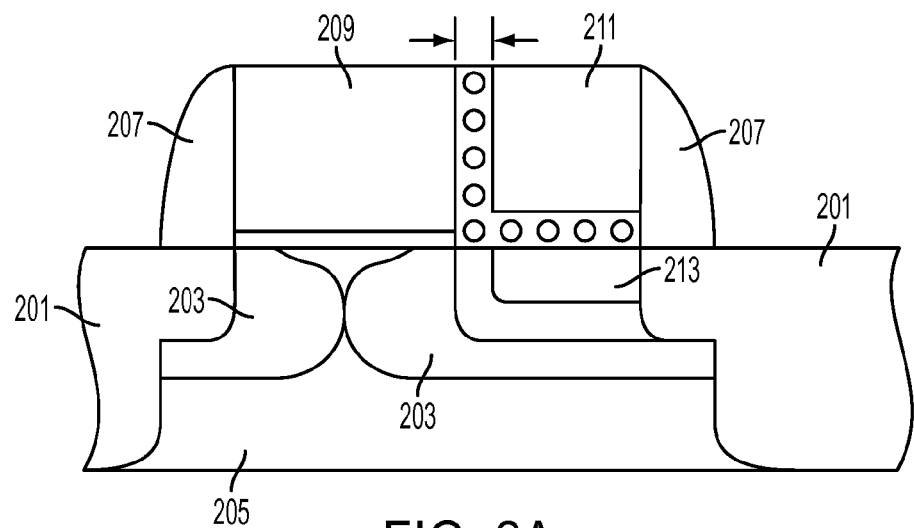
FIGS. 2A and 2B schematically illustrate a conventional split-gate non-volatile, memory device.
Figure 2B:
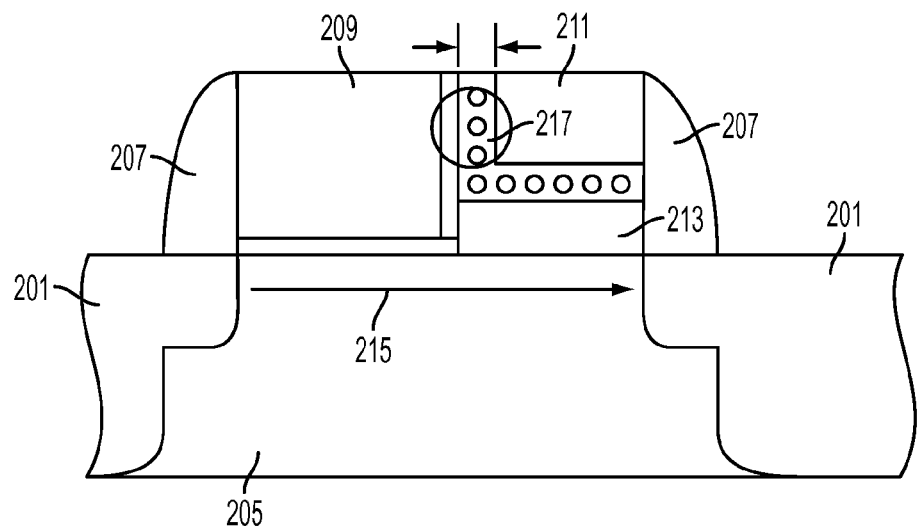
Figure 3A:
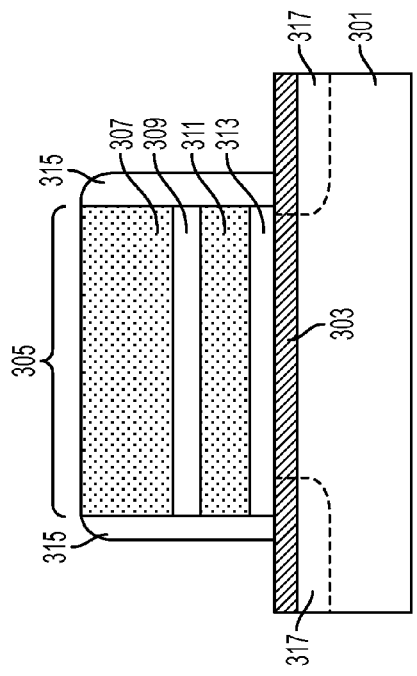
Figure 3B:
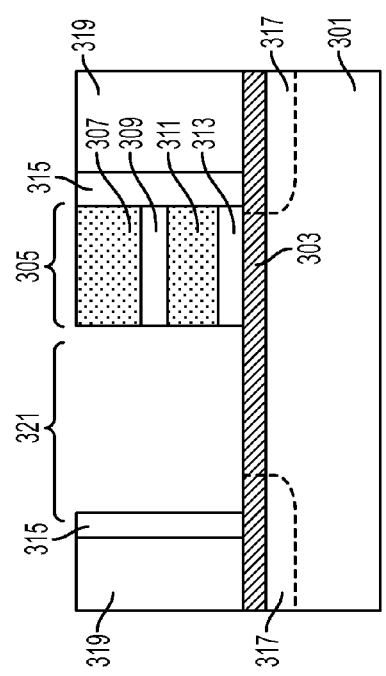

As illustrated in FIG. 3B, a memory gate stack 305 may then be provided over the band engineered channel 303 (e.g., a floating gate type or a charge trapping type). As shown, the memory gate stack 305 includes a control gate 307, an interpoly dielectric layer 309, a floating gate 311, and a tunneling oxide layer 313. Source/drain extensions may then be implanted, followed by formation of dielectric spacers 315 and deep implantation resulting in source/drain regions 317.

Figure 3C:
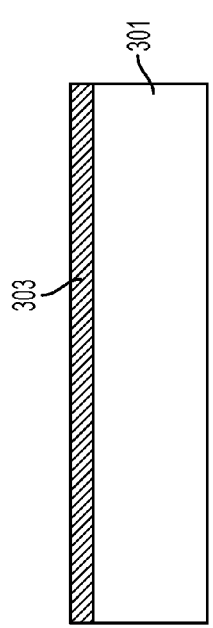
Figure 3D:
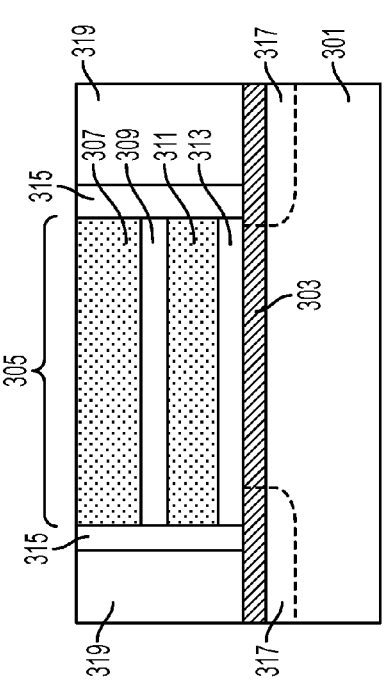

As illustrated in FIG. 3C, interlayer dielectric (ILD) 319 may, for instance, be formed over the entire substrate 301, and planarization may then be implemented, as by chemical-mechanical polishing (CMP), such that the upper surface of the memory gate stack 305, dielectric spacers 315, and interlayer dielectric 319 are substantially coplanar. As shown in FIG. 3D, a portion of the memory gate stack 305 may be removed to form an opening 321. Removal may be implemented, for example, by reactive ion etching (RIE), in which case a protective layer (e.g., a nitride such as titanium nitride (TiN), Barrier Anti Reflecting Coating (BARC), or a photo-resist (PR)) may be utilized to protect the memory gate stack 305 during the RIE process. Thereafter, as shown in FIG. 3E, sidewall spacers 323 may be formed in the opening 321 to insulate the word gate 325 from the memory gate stack 305.

As illustrated in FIG. 3F, the opening 321 is then recessed through, e.g., extending below, the band engineered channel 303. Subsequently, as illustrated in FIG. 3G, the word gate 325 may be formed in the recessed opening 321. A gate dielectric layer 327 (e.g., silicon oxide, high-k dielectric, work function tuning material, etc.) is formed in the recessed opening 321, followed by forming the word gate 325 therein. Word gate 325 may comprise a-Si, poly-Si, or a metal. After forming word gate 325, planarization may then be implemented, as by CMP. Subsequently, back-end-of-line (BEOL) processing may be implemented in accordance with conventional techniques.

Figure 4A:
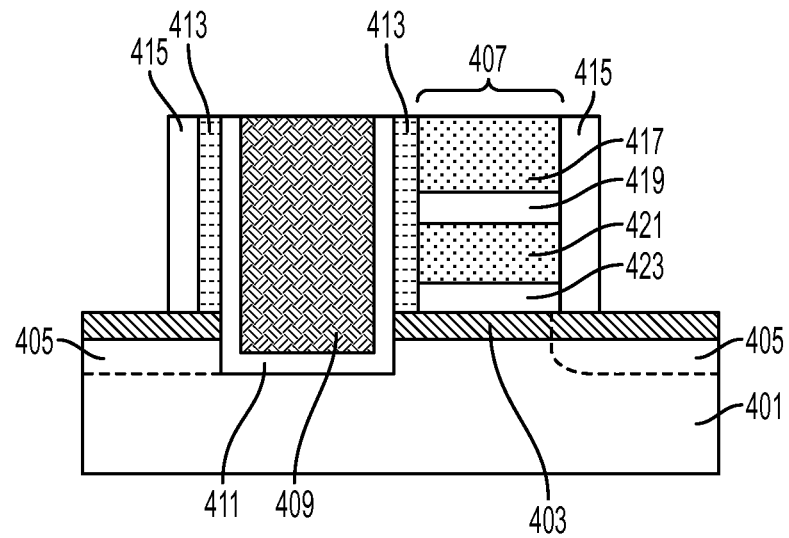
Figure 4B:
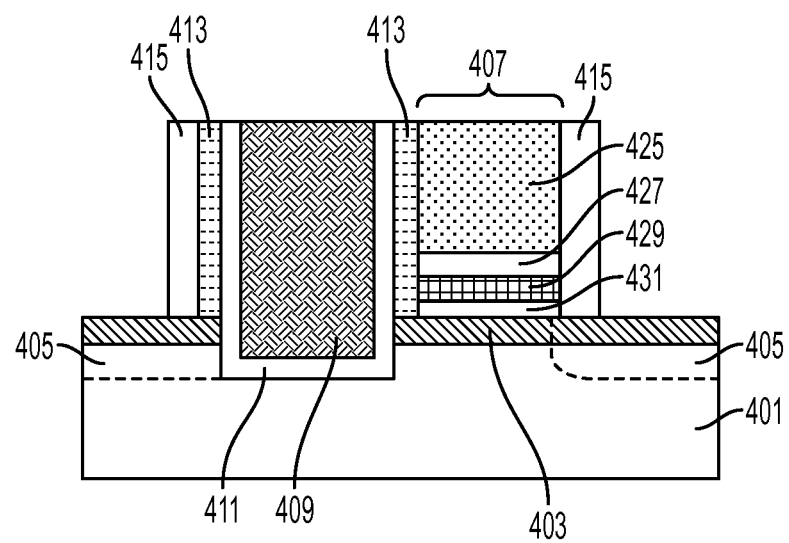

FIGS. 4A and 4B schematically illustrate split-gate structures utilizing a band engineered channel associated respectively with a floating gate type and with a charge trapping type in accordance with embodiments of the present disclosure. Adverting to FIG. 4A, the illustrated split-gate structure comprises substrate 401, band engineered channel 403, source/drain regions 405, memory gate stack 407, word gate 409 over gate dielectric layer 411, sidewall spacers 413, and dielectric spacers 415. Memory gate stack 407 comprises control gate 417, interpoly dielectric (IPD) layer 419, floating gate 421, and tunneling oxide layer 423. In FIG. 4B, the illustrated split-gate structure comprises substrate 401, band engineered channel 403, source/drain regions 405, memory gate stack 407, word gate 409 over gate dielectric layer 411, sidewall spacers 413, and dielectric spacers 415. In FIG. 4B, memory gate stack 407 comprises control gate 425, blocking oxide layer 427, charge trapping layer 429, and tunneling oxide layer 431.

Embodiments of the present disclosure comprising an advantageously embedded word gate reduce punchthrough by providing a longer $L_{eff}$ and a shallower source junction depth. Embodiments of the present disclosure comprising a band engineered channel advantageously increase the impact-ionization rate, thereby increasing program speed.

Embodiments include providing a narrower bandgap material near the drain side to increase band-to-band hot hole (BBHH) generation rate and, hence, erase efficiency. By providing an embedded word gate and a band engineered channel, a larger number of generated carriers are injected directly into the memory cell, compared with a lateral split-gate device with a band engineered channel. In addition, the structure illustrated in FIG. 4B does not have a sidewall with the charge trapping layer 429, thereby avoiding the adverse impact of trapped charges.

Figure 5A:
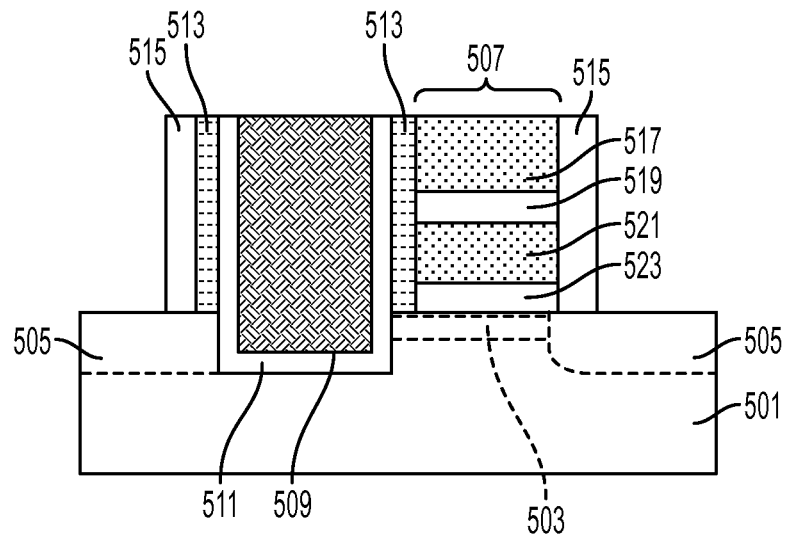
FIGS. 5A and 5B schematically illustrate split-gate structures utilizing a buried channel associated respectively with a floating gate type and with a charge trapping type in accordance with embodiments of the present disclosure.
Figure 5B:
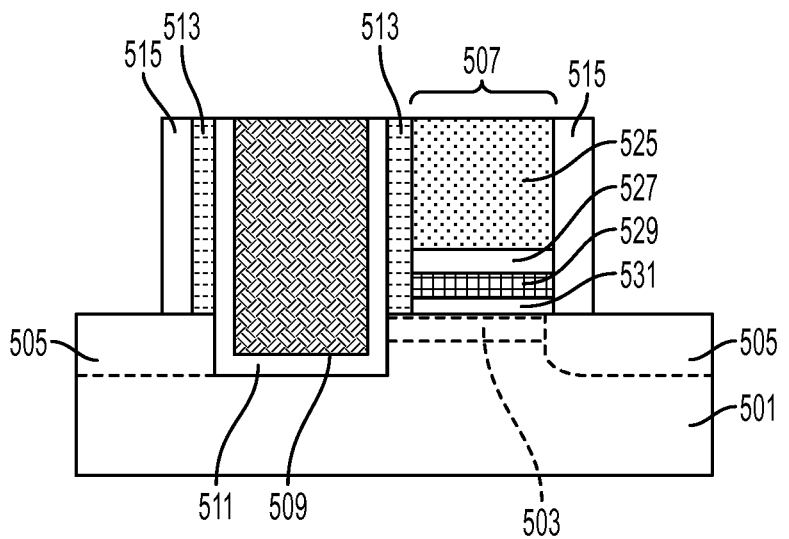

FIGS. 5A and 5B schematically illustrate split-gate structures utilizing a buried channel associated respectively with a floating gate type and with a charge trapping type in accordance with embodiments of the present disclosure. Adverting to FIG. 5A, the illustrated split-gate structure comprises substrate 501, buried channel 503, source/drain regions 505, memory gate stack 507, word gate 509 over a gate dielectric layer 511, sidewall spacers 513, and dielectric spacers 515. Memory gate stack 507 comprises control gate 517, interpoly dielectric (IPD) layer 519, floating gate 521, and tunneling oxide 523. In FIG. 5B, the illustrated split-gate structure comprises substrate 501, buried channel 503, source/drain regions 505, memory gate stack 507, word gate 509 over gate dielectric layer 511, sidewall spacers 513, and dielectric spacers 515. In FIG. 5B, memory gate stack 507 comprises control gate 525, blocking oxide layer 527, charge trapping layer 529, and tunneling oxide layer 531. In the structures of FIGS. 5A and 5B, the buried channel provides superior endurance. The buried channel may be formed by doping the surface channel of the memory cell oppositely to that of the substrate. As such, the inversion channel is shifted away from the surface, resulting in a memory cell less sensitive to interface trap density ($D_{it}$) generation after cycling. Consequently, the memory cell exhibits better endurance characteristics.

The embodiments of the present disclosure can achieve several technical effects, including improved punchthrough immunity, better program disturbance immunity, enhanced cell endurance, and increased programming/erasing speed. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a memory gate stack over a channel region;
providing a word gate extending from an upper portion at an upper surface of the memory gate stack to a lower portion below an upper surface of a substrate at the channel region and below an upper surface of the substrate at source and drain regions, wherein the lower portion of the word gate contacts both the channel region and a source or drain region, and wherein the upper portion of the word gate and the lower portion of the word gate have the same width; and
planarizing the memory gate stack and the word gate such that an upper surface of the memory gate stack and an upper surface of the word gate are substantially coplanar.

2. The method according to claim 1, comprising:
forming a band engineered channel as the channel region.

3. The method according to claim 2, further comprising:
forming the band engineered channel as a single layer or multiple layers.

4. The method according to claim 1, further comprising:
forming a buried channel in the substrate as the channel region.

5. The method according to claim 4, further comprising:
forming the buried channel 3 to 30 nm below the upper surface of the substrate.

6. The method according to claim 1, comprising:
removing a portion of the memory gate stack to form an opening.

7. The method according to claim 6, comprising:
forming a band engineered channel as the channel region;
forming the opening through the band engineered channel; and
providing a dielectric layer and the word gate in the opening.

8. The method according to claim 6, comprising:
forming a buried channel as the channel region;
forming the opening alongside of and below the buried channel; and
providing a dielectric layer and the word gate in the opening.

9. The method according to claim 1, comprising providing the word gate extending below the channel region.

10. The method according to claim 1, further comprising:
providing the word gate extending at least 5 nanometers below the upper surface of the substrate.

11. A method comprising:
providing a memory gate stack over a channel region;
removing a portion of the memory gate stack to form an opening;
providing a word gate, having sidewall spacers on side surfaces thereof and extending from an upper portion at an upper surface of the memory gate stack to a lower portion below an upper surface of a substrate at the channel region and below an upper surface of the substrate at source and drain regions, in the opening, wherein the lower portion of the word gate contacts both the channel region and a source or drain region, and wherein the upper portion of the word gate and the lower portion of the word gate have the same width; and
planarizing the memory gate stack and the word gate such that an upper surface of the memory gate stack and an upper surface of the word gate are substantially coplanar.

12. The method according to claim 11, comprising:
providing a band engineered channel as the channel region; and
forming the opening such that it extends through the band engineered channel, wherein the word gate extends through the band engineered channel.

13. The method according to claim 11, comprising:
providing a buried channel as the channel region; and
forming the opening such that it extends below the buried channel.

* * * * *